(12) United States Patent
Engel et al.

(10) Patent No.: US 10,276,698 B2
(45) Date of Patent: Apr. 30, 2019

(54) SCALABLE PROCESS FOR THE FORMATION OF SELF ALIGNED, PLANAR ELECTRODES FOR DEVICES EMPLOYING ONE OR TWO DIMENSIONAL LATTICE STRUCTURES

(71) Applicant: INTERNATIONAL BUSINESS MACHINES CORPORATION, Armonk, NY (US)

(72) Inventors: Michael Engel, Ossining, NY (US); Mathias B. Steiner, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/919,312

(22) Filed: Oct. 21, 2015

(65) Prior Publication Data

US 2017/0117367 A1   Apr. 27, 2017

(51) Int. Cl.
| | |
|---|---|
| *H01L 21/336* | (2006.01) |
| *H01L 21/8234* | (2006.01) |
| *H01L 29/66* | (2006.01) |
| *H01L 29/16* | (2006.01) |
| *H01L 29/786* | (2006.01) |
| *H01L 29/417* | (2006.01) |
| *H01L 29/775* | (2006.01) |
| *H01L 29/778* | (2006.01) |
| *H01L 51/05* | (2006.01) |

(Continued)

(52) U.S. Cl.
CPC .... *H01L 29/66969* (2013.01); *H01L 29/1606* (2013.01); *H01L 29/41725* (2013.01); *H01L 29/66045* (2013.01); *H01L 29/66742* (2013.01); *H01L 29/775* (2013.01); *H01L 29/778* (2013.01); *H01L 29/78696* (2013.01); *H01L 29/24* (2013.01); *H01L 51/0048* (2013.01); *H01L 51/0545* (2013.01)

(58) Field of Classification Search
CPC ........... H01L 29/1606; H01L 21/76846; H01L 21/76877; H01L 29/401; H01L 51/102; H01L 2221/68327; H01L 29/66787
USPC ........................................................ 438/197
See application file for complete search history.

(56) References Cited

U.S. PATENT DOCUMENTS

| | | |
|---|---|---|
| 3,675,313 A | 7/1972 | Driver et al. |
| 6,673,661 B1 * | 1/2004 | Liu ..................... H01L 29/6675 257/E21.412 |
| 6,891,227 B2 | 5/2005 | Appenzeller et al. |

(Continued)

OTHER PUBLICATIONS

Chen et al., "Self-aligned carbon nanotube transistors with charge transfer doping," Applied Physics Letters, vol. 86, No. 12, Mar. 2005. (3 pages).

(Continued)

*Primary Examiner* — Duy T Nguyen
(74) *Attorney, Agent, or Firm* — Tutunjian & Bitetto, P.C.; Vazken Alexanian

(57) ABSTRACT

A method of forming an electrical device that includes forming a gate dielectric layer over a gate electrode, forming source and drain electrodes on opposing sides of the gate electrode, wherein one end of the source and drain electrodes provides a coplanar surface with the gate dielectric, and positioning a 1D or 2D nanoscale material on the coplanar surface to provide the channel region of the electrical device.

11 Claims, 1 Drawing Sheet

(51) Int. Cl.
  *H01L 51/00* (2006.01)
  *H01L 29/24* (2006.01)

(56) References Cited

U.S. PATENT DOCUMENTS

| | | | |
|---|---|---|---|
| 7,253,431 B2 | 8/2007 | Afzali-Ardakani et al. | |
| 7,687,308 B2 | 3/2010 | Parikh et al. | |
| 7,858,454 B2 | 12/2010 | Kalburge | |
| 7,858,989 B2* | 12/2010 | Chen | B82Y 10/00 257/76 |
| 8,106,383 B2 | 1/2012 | Jenkins et al. | |
| 8,124,463 B2 | 2/2012 | Chen et al. | |
| 8,344,358 B2 | 1/2013 | Avouris et al. | |
| 8,513,099 B2 | 8/2013 | Chang et al. | |
| 8,558,281 B1 | 10/2013 | Regan et al. | |
| 8,569,121 B2 | 10/2013 | Haensch et al. | |
| 8,674,412 B2 | 3/2014 | Franklin et al. | |
| 8,766,321 B2 | 7/2014 | Shinohara et al. | |
| 8,785,262 B2 | 7/2014 | Farmer et al. | |
| 8,809,153 B2 | 8/2014 | Afzali-Ardakani et al. | |
| 2003/0160235 A1 | 8/2003 | Hirai | |
| 2004/0075124 A1 | 4/2004 | Wu et al. | |
| 2004/0245527 A1* | 12/2004 | Tsukagoshi | B82Y 10/00 257/77 |
| 2011/0089995 A1* | 4/2011 | Heo | H01L 29/1606 327/534 |
| 2011/0220891 A1* | 9/2011 | Fujii | H01L 27/1225 257/57 |
| 2012/0326126 A1 | 12/2012 | Chen et al. | |
| 2013/0099204 A1 | 4/2013 | Avouris et al. | |
| 2013/0105765 A1* | 5/2013 | Haensch | H01L 29/42364 257/29 |
| 2013/0240886 A1* | 9/2013 | Yeh | H01L 27/1222 257/57 |
| 2013/0248823 A1 | 9/2013 | Bol et al. | |
| 2014/0239256 A1* | 8/2014 | Kim | H01L 21/0262 257/29 |
| 2014/0312412 A1* | 10/2014 | Guo | H01L 29/41775 257/330 |

OTHER PUBLICATIONS

Farmer et al., "Graphene field-effect transistors with self-aligned gates," Applied Physics Letters, vol. 97, No. 1, Jul. 2010. (3 pages).
U.S. Office Action issued in U.S. Appl. No. 15/298,771 dated Apr. 13, 2018, 14 pages.
U.S. Office Action issued in U.S. Appl. No. 15/298,771 dated Sep. 25, 2018, 12 pages.
U.S. Office Action issued in U.S. Appl. No. 15/298,771 dated Dec. 28, 2018, 9 pages.

* cited by examiner

SCALABLE PROCESS FOR THE FORMATION OF SELF ALIGNED, PLANAR ELECTRODES FOR DEVICES EMPLOYING ONE OR TWO DIMENSIONAL LATTICE STRUCTURES

BACKGROUND

Technical Field

The present disclosure relates to methods for forming structures including one or two dimensional lattice structures, and devices including one or two dimensional lattice structures.

Description of the Related Art

Microelectronics applications have been increasingly employing one and two dimensional devices, such as graphene devices, due to their conductive, mechanical and other properties. For example, processing of graphene is often unconventional relative to traditional processing techniques and is often difficult to control and incorporate into semiconductor processing. One dimensional and two dimensional nanometer scale materials, such as carbon nanotubes and graphene, typically suffer from degradation and performance limitations when processed into electronic or photonic devices.

SUMMARY

In one aspect, the present disclosure provides a method of forming an electrical device, in which the channel region of the electrical device is provided by a 1D and/or 2D nanoscale material. In one embodiment, the method includes forming a gate dielectric layer over a gate electrode. Source and drain electrodes are formed on opposing sides of the gate electrode, wherein one end of the source and drain electrodes provides a coplanar surface with the gate dielectric. A 1D or 2D nano scale material is formed on the coplanar surface to provide the channel region of the device.

In another embodiment, the method includes forming a gate dielectric layer over a gate electrode. Source and drain electrodes are formed on opposing sides of the gate electrode, wherein one end of the source and drain electrodes provides a coplanar surface with the gate dielectric. A 1D or 2D nanoscale material comprising carbon nanotubes, graphene, transition metal dichalcogenides, black phosphorus or a combination thereof is formed on the coplanar surface to provide the channel region of the device.

In another aspect of the disclosure, an electrical device is provided that comprises a planar interface provided by a gate dielectric, a source electrode and a drain electrode that are arranged in coplanar relationship. A 1D or 2D nanoscale material providing the channel region of the electrical device that is present on the planar interface and is in direct contact with a first face of the gate dielectric. A gate electrode present on a second face of the gate dielectric that is opposite the first face of the gate dielectric.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
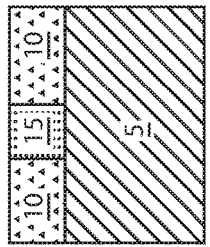
FIG. 1 is a side cross-sectional view depicting forming a photoresist layer on an insulating substrate, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a scalable process for the formation of self-aligned, planar electrodes for devices employing one or two dimensional lattice structures. It has been determined that in some 1D (one dimensional) and 2D (two dimensional) nanometer scale materials, such as carbon nanotubes and graphene, the material can suffer from degradation and performance limitations when processed into electronic or photonic devices. For example, in some prior methods, the nanomaterial are integrated into the electrical devices in an early stage of the manufacturing process, and it has been determined that exposing the 1D and/or 2D nanometer scale materials to early fabrication steps for semiconductor devices, such as etch processing and annealing, deteriorate the physical properties of the 1D and/or 2D nanometer scale materials, which, ultimately can limit the performance of the electrical device. In some embodiments, the methods and structures disclosed herein can overcome the deficiencies of prior methods with a manufacturing process that self-aligns the dimensions of the 1D or 2D material to match the target device dimensions that are determined by the specifics of the scalable gate stack; and allows for placing arbitrary, 1D or 2D nanomaterials on a planarized substrate at the end of the manufacturing process. As will be described in greater detail below, the methods disclosed herein allow for the device dimensions to be freely scalable and the material limitations of prior methods that can limit device performance can be kept at a minimum. In some embodiments, the methods and structures of the present disclosure combine three semiconductor processing steps, e.g., a dielectric thin film deposition process step, a polishing process step, and an etch process step, in order to sale the device channel dimensions to control target values which are given by the dimension of a gate electrode and the gate dielectric. Thereafter, the channel material, i.e., 1D or 2D nanoscale material, is deployed on the planarized stack without the need for the 1D or 2D nanoscale material to be subjected to further processing steps. As will be discussed in greater detail below, one advantage of the methods disclosed herein is that the device channel dimensions can be freely scaled. The 1D or 2D nanoscale materials employed herein may include carbon nanotubes, graphene, transition metal dichalcogenides, black phosphorus, or other like materials. The methods and structures disclosed herein are now described with greater detail referring to FIGS. 1-9.

FIG. 1 depicts one embodiment of forming a photoresist layer 10 on an insulating substrate 5. The insulating substrate 5 may be composed of any dielectric material, such as a nitride or an oxide. In some examples, the insulating substrate 5 may be composed of glass, quartz, silicon carbide, silicon boride, silicon nitride, silicon oxide, plastics polymers and combinations thereof. The upper surface of the insulating substrate 5 may be planarized to provide a planar surface. Planarization can be provided by chemical mechanical planarization (CMP).

In some embodiments, the insulating substrate 5 is coated with a positive photoresist (e.g. PMMA) for mask production. The photoresist layer 10 may be deposited onto the insulating substrate using a deposition method, such as spin on deposition. In some embodiments, following deposition the photoresist may be baked. Although PMMA has been listed above as one composition for the photoresist layer 10, the present disclosure is not limited to only this composition, as other photoresist compositions are equally applicable to the present disclosure, such as poly(methyl glutarimide) (PMGI), phenol formaldehyde resin (DNQ/Novolac), SU-8, hydrogen silsesquioxane (HSQ) and combinations thereof. In other embodiments, instead of using a softmask that is composed of a photoresist material, a hard mask may be employed. Hardmask materials that are suitable for use with the methods disclosed herein may include an oxide, nitride, or metal deposited by a deposition method.

Figure 2:
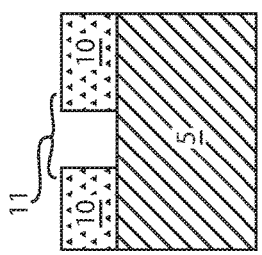
FIG. 2 is a side cross-sectional view depicting patterning the photoresist layer to form an opening extending through the photoresist layer to the insulating substrate, in accordance with one embodiment of the present disclosure.
Figure 3:
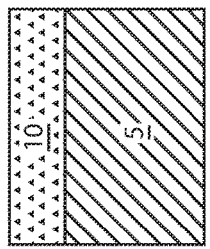
FIG. 3 is a side cross-sectional view depicting one embodiment of forming a first conductive material for a gate electrode in the opening depicted in FIG. 2, in accordance with one embodiment of the present disclosure.
Figure 4:
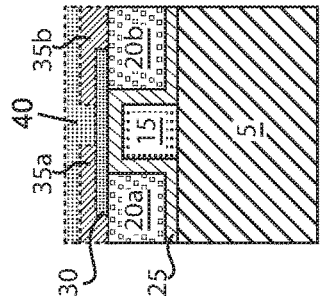
FIG. 4 is a side cross-sectional view depicting removing the photoresist layer, in accordance with one embodiment of the present disclosure.

Referring to FIGS. 2-4, a gate electrode 15 may be formed employing the photoresist layer 10 using a lift off process. In a general lift off process, a pattern is first defined on the substrate 5 using a photoresist, e.g., photoresist layer 10. Thereafter, a film, e.g., an electrically conductive film, is deposited all over the substrate 5, covering the photoresist layer 10 and areas in which the photoresist layer has been cleared. During the actual "lifting off", the photoresist under the film is removed with solvent, taking the film with it, and leaving only the film which was deposited directly on the substrate 5, i.e., within the opening formed by the portion of the photoresist layer 10 that was cleared during development. The remaining portion of the electrically conductive film provides the gate electrode 15.

FIG. 2 depicts patterning the photoresist layer 10 to form an opening 11 extending through the photoresist layer 10 to the insulating substrate 5. For example, a pattern is produced by exposing the photoresist layer 10 to a pattern of radiation; and then developing the pattern into the photoresist layer 10 utilizing a resist developer. In some examples, exposing the photoresist layer 10 to a pattern of radiation may include e-beam development. In some examples, the pattern of radiation may be provided by a UV light with a wavelength of 366 nm, with an intensity of 6 mW/cm$^2$ for a time period of 30 seconds.

FIG. 2 also depicts developing the patterned photoresist layer 10 to clear the portion of the photoresist layer 10 that has been exposed to the pattern of radiation. The patterned portion of the photoresist layer 10 may be removed by a chemical developer. Once example of a chemical developer may include tetramethylammonium hydroxide (TMAH). After development of the patterned photoresist layer 10, an opening 11 is formed through the photoresist layer 10 extending to the insulating substrate 5. The opening 11 has dimensions and a geometry that is selected to provide the later formed gate electrode 15.

FIG. 3 depicts one embodiment of forming a first conductive material for a gate electrode 15 in the opening 11 though the patterned photoresist layer 10 that is depicted in FIG. 2. The first conductive material may be composed of a metal. Examples of metals suitable for the first conductive material include tungsten (W), titanium (Ti), palladium (Pd), gold (Au), chromium (Cr), and combinations thereof. The first conductive material for the gate electrode may be deposited using a physical vapor deposition (PVD) method. Examples of PVD methods that are suitable for use with the present disclosure include plating, electroplating, electroless plating, sputtering and combinations thereof. The layer of the first conductive material may be blanket deposited atop the entire structure depicted in FIG. 2. For example, the layer of the first conductive material may be formed on the upper surface of the photoresist layer 10, and filling the opening through the photoresist layer 10. The first conductive material may be deposited to a thickness that fills the entirety of the opening 11. For example, the thickness of the layer of the first conductive material may range from 5 nm to 1250 nm. In another example, the thickness of the layer of the first conductive material may range from 10 nm to 1000 nm.

FIG. 4 depicts removing the remaining portions of the photoresist layer 10 after the first conductive material for the gate electrode 15 is formed in the opening 11. By using lift off methods, and portion of the first conductive material layer that extends from the opening 11 is also removed when the photoresist layer 10 is removed. Removing the remaining portions of the photoresist layer 10 may be accomplished chemically. For example, chemical removers including acetone may be suitable for removing the photoresist layer 10, as well as oxygen ashing, or photoresist developers.

Referring to FIG. 4, following removal of the remaining portions of the photoresist layer 10, the sidewalls of the gate electrode 15 are exposed. The gate electrode 15 may have a height ranging from 5 nm to 1250 nm, and a width ranging from 5 nm to 1250 nm. In another embodiment, the gate electrode 15 may have a height H1 ranging from 10 nm to 1000 nm, and a width ranging from 10 nm to 1000 nm. The gate electrode width may range from 10 nm to 1000 microns.

Figure 5:
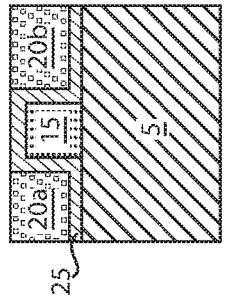
FIG. 5 is a side cross-sectional view depicting forming a gate dielectric layer on the conductive material for the gate electrode that is depicted in FIG. 4.

FIG. 5 depicts forming a gate dielectric layer 25 on the conductive material for the gate electrode 15 that is depicted in FIG. 4. The gate dielectric layer 25 may be composed of any dielectric material that is suitable for a gate dielectric. For example, the gate dielectric 25 may be composed of an oxide, such as silicon oxide ($SiO_2$) or aluminum oxide ($Al_2O_3$), or a nitride, such as silicon nitride. In some embodiments, the gate dielectric layer 25 may be composed of a high-k dielectric. The term high-k denotes that the dielectric constant of the material is greater than the dielectric constant of silicon oxide at room temperature, e.g., 20° C. to 25° C. In some embodiments, the dielectric constant of a high-k dielectric material may be 4.0 or higher. In another example, dielectric constant of a high-k dielectric material that is suitable for the gate dielectric layer 25 may be greater than 7.0. In some embodiments, the high-k dielectric material used for the gate dielectric layer 25 is a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. The high-k dielectric material for the gate dielectric layer 25 may also be selected from hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof. The gate dielectric layer 25 may be deposited or formed. The gate dielectric layer 25 is a conformal layer. The term "conformal" denotes a layer having a thickness that does not deviate from greater than or less than 30% of an average value for the thickness of the layer. For example, the thickness of the gate dielectric layer 25 is substantially the same in the portions of the gate dielectric layer 25 that is present on the sidewalls of the gate electrode 15, and the portions of the gate dielectric layer 25 that is present on the upper surface of the gate electrode 15. The gate dielectric layer 25 may be deposited using chemical vapor deposition (CVD), atomic layer deposition (ALD), physical vapor deposition (PVD) or a combination thereof. In some embodiments, when the gate dielectric layer 25 is deposited using chemical vapor deposition (CVD), the CVD process may include plasma enhanced chemical vapor deposition (PECVD) or metal organic chemical vapor deposition (MOCVD). The thickness of the gate dielectric layer 25 may range from 1 nm to 1 micron. In another embodiment, the thickness of the gate dielectric layer 25 may range from 2 nm to 500 nm. In yet another embodiment, the thickness of the gate dielectric layer 25 may range from 2 nm to 10 nm.

Figure 6:
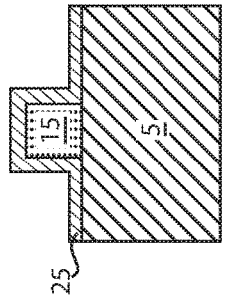
FIG. 6 is a side cross-sectional view depicting depositing a second conductive material for source and drain contacts on the dielectric layer depicted in FIG. 5.

FIG. 6 depicts depositing a second conductive material for source and drain contacts 20a, 20b on the dielectric layer 25 depicted in FIG. 5. The second conductive material for the source and drain contacts 20a, 20b may be composed of the same or a different material as the first conductive material for the gate electrode 15. In some embodiments, the second conductive material for the source and drain contacts 20a, 20b is composed of tungsten (W), titanium (Ti), palladium (Pd), gold (Au), chromium (Cr), or a combinations thereof. The first conductive material for the gate electrode may be deposited using a physical vapor deposition (PVD) method. Examples of PVD methods that are suitable for use with the present disclosure include plating, electroplating, electroless plating, sputtering and combinations thereof. The second conductive material may be blanket deposited atop the entire structure depicted in FIG. 5. For example, the layer of the second conductive material may be formed on the portions of the gate dielectric layer 25 that are present on the substrate 10 on opposing sides of the gate electrode 15. The second conductive material may be deposited to a thickness that is at least as great as the height of the upper surface of the gate dielectric layer 25, as measured from the upper surface of the insulating substrate 5. For example, the thickness of the layer of the second conductive material for the source and drain contacts 20a, 20b may range from 5 nm to 1250 nm. In another example, the thickness of the layer of the second conductive material for the source and drain contacts 20a, 20b may range from 10 nm to 1000 nm.

In some embodiments, after depositing the second conductive material for the source and drain contacts 20a, 20b, a planarization process may be applied to the second conductive material. The planarization process may be applied to provide that the upper surface of the source and drain contacts 20a, 20b is coplanar with the upper surface of the gate dielectric layer 25. The planarization process can be provided by chemical mechanical planarization (CMP). In some embodiments, an etch process, such as reactive ion etch (RIE), may be substituted for the planarization process, or an etch process may be used in combination with the planarization process.

It is noted that the source and drain contacts 20a, 20b are separated from the gate electrode 15 by the portion of the gate dielectric layer 25 that is present on sidewalls of the gate electrode 15.

Figure 7:
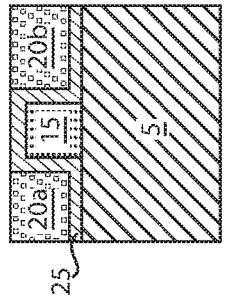
FIG. 7 is a side cross-sectional view depicting forming a 1D (one dimensional) and/or 2D (two dimensional) nanometer scale material on the dielectric layer that provides the gate dielectric, and the second conductive material for the source and drain contacts, wherein the 1D and/or 2D nanometer scale material provides a channel region in accordance with one embodiment of the present disclosure.

FIG. 7 depicts forming a 1D (one dimensional) and/or 2D (two dimensional) nanometer scale material 30 on the dielectric layer that provides the gate dielectric, and the second conductive material for the source and drain contacts, wherein the 1D and/or 2D nanometer scale material provides a channel region for the electronic device. The channel region is the region underlying the gate structure and between the source and drain of a semiconductor device that becomes conductive when the electrical device is turned on. In the present case the gate dielectric layer 25 and the gate electrode 15 provide the gate structure.

The terms "nanometer scale" or "nanoscale" denote that at least one dimension of the structure being referred to is less than 100 nm. In some examples, the largest dimension of the nanoscale material is less than 100 nm. In further examples, the largest dimension of the nanoscale material is less than 50 nm. A "one dimensional (1D)" material denotes a material in which one dimension is greater than the other two dimensions. One example of a one dimensional (1D) material is a nanorod. A "two dimensional (2D)" material denotes a material in which two dimensions are greater than the remaining dimensions. One example of a two dimensional (2D) material is a nanosheets or graphene.

Suitable nanomaterials for the 1D (one dimensional) and/or 2D (two dimensional) nanometer scale material 30 include single-layer or multi-layer organic and inorganic layered materials, e.g., graphene, transition metal dichalcogenides, black phosphorus, regular arrays and random networks/thin films made of quasi-one dimensional lattice structures, such as organic and inorganic nanotubes/nanowires. Graphene is a one atom thick layer of sp2 bonded carbon atoms arranged in a hexagonal or honeycomb lattice. Other examples of 1D (one dimensional) and/or 2D (two dimensional) nanometer scale materials include carbon nanotubes. Transition metal dichalcogenides suitable for use as 1D (one dimensional) and/or 2D (two dimensional) nanometer scale materials may have a molecular formula of $MX_2$, where M is a metallic element selected from the group consisting of titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg) and combinations thereof, and X is a chalcogen element selected from the group consisting of sulfur (S), selenium (Se), tellurium (Te), oxygen (O) and combinations thereof. A "nanowire" is a nanostructure, with the diameter of the order of a nanometer ($10^{-9}$ meters), which can also be defined as the ratio of the length to width being greater than 1000. Alternatively, nanowires can be defined as structures that have a thickness or diameter constrained to tens of nanometers or less and an unconstrained length. Nanowires include superconducting (e.g., YBCO), metallic (e.g., Ni, Pt, Au), semiconducting (e.g., Si, InP, GaN, etc.), and insulating (e.g., $SiO_2$, $TiO_2$) structures.

Suitable placement methods for the above materials include in-situ material growth, e.g. through chemical vapor deposition, electric field-assisted assembly from solution, or material exfoliation and transfer, e.g., bonding.

Because the 1D (one dimensional) and/or 2D (two dimensional) nanometer scale material 30 is formed after the gate structure, i.e., gate electrode 16 and gate dielectric layer 25, and the source and drain contacts 20a, 20b, the 1D (one dimensional) and/or 2D (two dimensional) nanometer scale material 30 is self-aligned to the gate structure, and the source and drain contacts 20a, 20b. For example, the 1D (one dimensional) and/or 2D (two dimensional) nanometer scale material 30 may be self-aligned to match the target device dimensions, e.g., the distance separating the source and drain contacts 20a, 20b. In this embodiment, the target device dimensions are determined by the specifics of the scalable gate stack, e.g., gate electrode 15. The method described herein also allows for the 1D (one dimensional) and/or 2D (two dimensional) nanometer scale material 30 to be positioned within the electrical device during a time period in the manufacturing of the device after the gate structure and source and drain contacts 20a, 20b have already been formed. This way, the device dimensions are freely scalable and material degradations that limit device performance are kept at a minimum.

Figure 8:
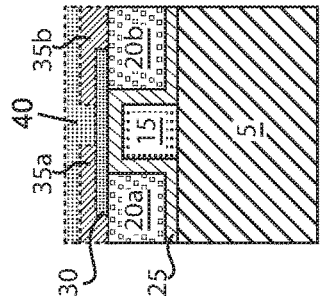
FIG. 8 is a side cross-sectional view depicting forming contacts to the structure depicted in FIG. 7, in accordance with one embodiment of the present disclosure.

FIG. 8 depicts forming contacts 35a, 35b to the structure depicted in FIG. 7. The contacts 35a, 35b depicted in FIG. 8 can be provided by a second layer of metallic contacts. A first contact 35a is formed on a first end of the 1D (one dimensional) and/or 2D (two dimensional) nanometer scale material 30 and is in contact with the source contact 20a. A second contact 35b is formed on a second end of the 1D (one dimensional) and/or 2D (two dimensional) nanometer scale material 30 and is in contact with the drain contact 20b. The composition of the contacts 35a, 35b that are depicted being formed in FIG. 8 may be the same or different from the source and drain contacts 20a, 20b that are described in FIG. 6. For example, the contacts 35a, 35b may be composed of tungsten (W), titanium (Ti), palladium (Pd), gold (Au), chromium (Cr) or combinations thereof. The contacts 35a, 35b may be formed using deposition, e.g., PVD, and etch processes. Forming the contacts 35a, 35b depicted in FIG. 8 is optional and may be omitted.

Figure 9:
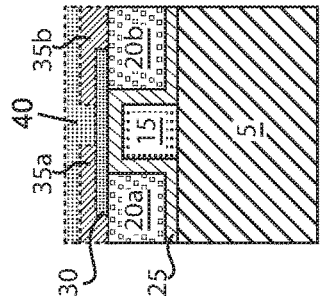
FIG. 9 is a side cross-sectional view depicting forming a dielectric cap over the contacts depicted in FIG. 8, in accordance with one embodiment of the present disclosure.

FIG. 9 depicts forming a dielectric cap 40 over the contacts 35a, 35b depicted in FIG. 8. The dielectric cap 40 may be composed of an oxide, nitride or oxynitride material. In some examples, the dielectric cap 40 may be composed of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). The dielectric cap 40 may be deposited using a deposition process, such as chemical vapor deposition (CVD), plasma enhanced chemical vapor deposition (PECVD), physical vapor deposition (PVD), spin on deposition and other like deposition processes. The dielectric cap 40 may be planarized using chemical mechanical planarization (CMP).

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electrical device comprising:
   forming a gate dielectric layer on a single layer insulating substrate and an upper surface and sidewall surfaces of a gate electrode on the single layer insulating substrate;
   forming source and drain electrodes on opposing sides of the gate electrode on the gate dielectric layer electrically isolating the source and drain electrodes from the single layer insulating substrate, wherein top surfaces of the source and drain electrodes provide a coplanar surface with a top surface of the gate dielectric layer; and
   positioning a one dimensional (1D) nanoscale material, a two dimensional (2D) nanoscale material, or a combination thereof on the coplanar surface to provide a channel region of the electrical device.

2. The method of claim 1, wherein forming the gate electrode comprises;
   forming a photoresist layer on the single layer insulating substrate;
   patterning the photoresist layer to provide an opening;
   depositing a first electrically conductive material in the opening; and
   removing a remaining portion of the photoresist layer.

3. The method of claim 1, wherein the dielectric material that provides the gate dielectric layer is conformally deposited.

4. The method of claim 1, wherein said forming the source and drain electrodes on opposing sides of the gate electrode comprises depositing a second electrically conductive material on the gate dielectric layer that is present over the gate electrode; and planarizing the second electrically conductive material to provide the source and drain electrodes having said coplanar surface with the gate dielectric layer.

5. The method of claim 1, wherein the one dimensional (1D) nanoscale material, the two dimensional (2D) nanoscale material, or the combination thereof comprises carbon nanotubes, graphene, transition metal dichalcogenides, black phosphorus or a combination thereof.

6. The method of claim 1, wherein positioning the one dimensional (1D) nanoscale material, the two dimensional (2D) nanoscale material, or the combination thereof comprises in-situ material growth, chemical vapor deposition, electric field-assisted assembly from solution, or material exfoliation and transfer.

7. A method of forming an electrical device comprising:
   forming a gate dielectric layer on a planarized single layer insulating substrate and an upper surface and sidewall surfaces of a gate electrode on the planarized single layer insulating substrate;
   forming source and drain electrodes on opposing sides of the gate electrode on the gate dielectric layer electrically isolating the source and drain electrodes from the planarized single layer insulating substrate, wherein top surfaces of the source and drain electrodes provide a coplanar surface with a top surface of the gate dielectric layer; and
   positioning a one dimensional (1D) nanoscale material, a two dimensional (2D) nanoscale material, or a combination thereof on the coplanar surface to provide a channel region of the electrical device, wherein the 1D or 2D nanoscale material comprises carbon nanotubes, graphene, black phosphorus or a combination thereof.

8. The method of claim 7, wherein forming the gate electrode comprises;
   forming a photoresist layer on the planarized single layer insulating substrate;
   patterning the photoresist layer to provide an opening;
   depositing a first electrically conductive material in the opening; and
   removing a remaining portion of the photoresist layer.

9. The method of claim 7, wherein said forming the source and drain electrodes on opposing sides of the gate electrode comprises depositing a second electrically conductive material on the gate dielectric layer that is present over the gate electrode.

10. The method of claim 9 further comprising planarizing the second electrically conductive material to provide the source and drain electrodes having said coplanar surface with the gate dielectric layer.

11. The method of claim 7, wherein positioning the one dimensional (1D) nanoscale material, the two dimensional (2D) nanoscale material, or the combination thereof comprises in-situ material growth, chemical vapor deposition, electric field-assisted assembly from solution, or material exfoliation and transfer.

* * * * *